(12) United States Patent  (10) Patent No.: US 9,407,201 B1
Iguchi                      (45) Date of Patent:     Aug. 2, 2016

(54) CRYSTAL OSCILLATOR CIRCUIT

(71) Applicant: Taiwan Semiconductor Manufacturing Company Limited, Hsinchu (TW)

(72) Inventor: Shunta Iguchi, Tokyo (JP)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/689,112

(22) Filed: Apr. 17, 2015

(51) Int. Cl.
H03B 5/32 (2006.01)
H03B 5/36 (2006.01)

(52) U.S. Cl.
CPC .......... H03B 5/364 (2013.01); H03B 5/36 (2013.01); H03B 5/366 (2013.01)

(58) Field of Classification Search
CPC ....................................................... H03B 5/36
USPC ............... 331/158, 116 FE, 116 R, 175, 183
See application file for complete search history.

(56) References Cited

U.S. PATENT DOCUMENTS

2008/0105054 A1* 5/2008 Kanai ............... G01C 19/5649
                                                          73/514.29

* cited by examiner

Primary Examiner — Arnold Kinkead
(74) Attorney, Agent, or Firm — Jones Day

(57) ABSTRACT

A crystal oscillator circuit includes an oscillator configured to generate a signal having an oscillation amplitude. A high-pass filter is configured to filter the output signal to generate a filtered output signal. An automatic gain control (AGC) module is configured to generate an initial gain control signal when the filtered output signal is not received by the AGC module. The high-pass filter is configured to prevent the filtered output signal from being received by the AGC module when the oscillation amplitude is substantially equal to zero. The AGC module is configured to generate a steady-state gain control signal when the filtered output signal is received by the AGC module. A gain stage is configured to provide a first amount of gain to the oscillator module based on the initial gain control signal and a second amount of gain to the oscillator module based on the steady-state gain control signal.

19 Claims, 7 Drawing Sheets

CRYSTAL OSCILLATOR CIRCUIT

BACKGROUND

Electronic circuits often utilize a clock circuit. The clock circuit is generally used to provide one or more stable timing signals to the electronic circuit. The clock circuit may include a crystal oscillator having some type of piezoelectric device, such as a quartz crystal or a crystal resonator, in order to generate an oscillation frequency. The clock circuit is generally implemented via an integrated circuit and in certain examples may utilize complementary metal-oxide-semiconductor (CMOS) technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
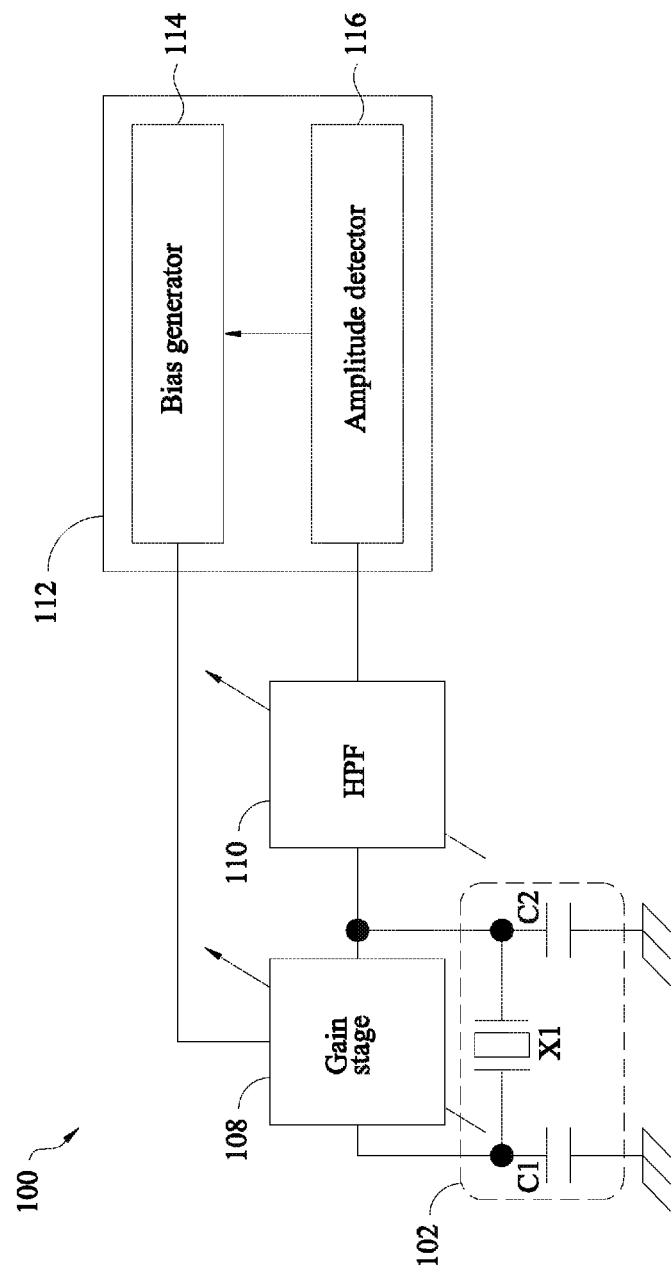
FIG. 1 depicts a block diagram of a crystal oscillator circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 depicts a block diagram of a crystal oscillator circuit 100, in accordance with some embodiments. The crystal oscillator circuit 100 includes an oscillator module 102, a gain stage 108, a high-pass filter 110, and an automatic gain control (AGC) module 112. Embodiments of the AGC module 112 include a bias generator 114 and an amplitude detector 116, as illustrated in FIG. 1. The oscillator module 102 includes an oscillator X1 that generates an oscillator output signal. In some examples, the oscillator X1 is a quartz vibrator or a piezoelectric crystal resonator. Further, in some examples, the oscillator output signal is a sine wave signal or a square wave signal generated by a resonance of the oscillator X1 and two capacitors C1, C2 included in the oscillator module 102.

The oscillator output signal of the oscillator module 102 is configured to operate as a highly stable and precise frequency clock and has an amplitude level and a DC bias level (i.e., a common mode level). Specifically, the oscillator output signal oscillates at a certain amplitude around the DC bias level. In an example, the frequency clock provided by the oscillator output signal is used to provide a stable timing signal for use in activating or operating components of an electronic circuit (e.g., logic gates, etc.). The gain stage 108 is configured to provide an amount of gain to the oscillator module 102 and thereby control the oscillation amplitude of the oscillator output signal.

As illustrated in FIG. 1, the oscillator module 102 is coupled to the high-pass filter 110. The high-pass filter 110 is configured to receive the oscillator output signal and to filter the oscillator output signal to generate a filtered output signal. Specifically, in filtering the oscillation output signal, the high-pass filter 110 is configured to (i) remove low-frequency noise in the oscillator output signal, and (ii) reject DC offset in the oscillator output signal. If not rejected, the DC offset causes the DC bias level of the oscillator output signal to vary from its nominal value. In an example, the DC offset is a result of process, voltage, and/or temperature (PVT) variation effects on the circuit 100.

In addition to providing the filtering functionality described above (i.e., rejecting low frequency noise and DC offset), the high-pass filter 110 also operates to pass the filtered output signal to the AGC module 112 or to prevent the filtered output signal from being passed to the AGC module 112. Specifically, and as described in further detail below, the high-pass filter 110 prevents the filtered output signal from being received by the AGC module 112 when the oscillation amplitude of the oscillator output signal is substantially equal to zero. Conversely, the high-pass filter 110 passes the filtered output signal to the AGC module 112 when the oscillation amplitude is not substantially equal to zero.

The AGC module 112 is coupled to the high-pass filter 110 and receives the filtered output signal when the filtered output signal is passed by the high-pass filter 110. The AGC module 112 is configured, generally, to generate a gain control signal. The gain control signal is fed back to the gain stage 108 to control the amount of gain provided from the gain stage 108 to the oscillation module 102. In some embodiments, the gain control signal and the gain stage 108 provide a negative feedback control loop for controlling the oscillation amplitude of the oscillator output signal. The gain control signal provided by the AGC module 112 varies depending on a mode of operation of the circuit 100. Specifically, during an initial mode of operation of the circuit 100, the AGC module 112 provides an initial gain control signal to the gain stage 108, and during a steady-state mode of operation of the circuit 100, the AGC module 112 provides a steady-state gain control signal.

During the initial mode of operation of the circuit 100, the oscillation amplitude of the oscillator output signal is substantially zero, and the high-pass filter 110 prevents the filtered output signal from being passed to the AGC module 112. In this mode, the AGC module 112 generates the initial gain control signal that is (i) not based on a configuration of the high-pass filter 110, and (ii) not based on a configuration of the gain stage 108. It should be appreciated that the initial gain control signal is not based on such configurations due to the decoupling of the filtered output signal, as described above.

The initial gain control signal controls the gain stage 108 to provide a maximum amount of gain to the oscillation module 102, allowing the oscillation module 102 to have sufficient startup gain. The maximum amount of gain is used to amplify the oscillator output signal of the oscillator module 102 and cause the oscillation amplitude of the output signal to be greater than zero. The initial gain control signal is generated by the bias generator 114 of the AGC module 112. The bias generator 114 is coupled to the gain stage 108, enabling the bias generator 114 to deliver the gain control signal to the gain stage 108. The initial gain control signal is predetermined to cause the gain stage 108 to provide the maximum amount of gain to the oscillation module 102.

During the initial mode of operation, with the filtered output signal being not passed to the AGC module 112, the amplitude detector 116 of the AGC module 112 is effectively disabled. As described below, the amplitude detector 116 is generally configured to monitor characteristics of the oscillator output signal, including its oscillation amplitude, and to control the bias generator 114 based on the oscillation amplitude. However, with the amplitude detector 116 being disabled, the initial gain control signal generated by the bias generator 114 is not based on the oscillation amplitude.

As the oscillation amplitude of the oscillator output signal increases, the high-pass filter 110 begins to pass the filtered output signal to the AGC module 112. With the filtered output signal being passed to the AGC module 112, the amplitude detector 116 is no longer disabled. Consequently, the amplitude detector 116 detects the increase in the oscillation amplitude and controls the bias generator 114 to adjust the gain control signal to reduce the gain provided by the gain stage 108 to the oscillation module 102. In this manner, the oscillation amplitude of the oscillator output signal is allowed to increase to a steady-state in a controlled manner.

In the steady-state mode of operation of the circuit 100, the amplitude detector 116 receives the filtered output signal and detects the oscillation amplitude of the filtered output signal. The amplitude detector 116 controls the bias generator 114, causing the bias generator 114 to generate the steady-state gain control signal based on the oscillation amplitude detected by the amplitude detector 116. The steady-state gain control signal is received by the gain stage 108, which utilizes the steady-state gain control signal to provide an amount of gain to oscillation module 102. The amount of gain is less than the maximum amount of gain and is configured to sustain the oscillation of the oscillator module 102 in the steady-state. As described in further detail below, the AGC module 112 utilizes a self-biasing architecture and does not utilize an external reference voltage or an external reference current.

In the illustration of FIG. 1, the gain stage 108 and the high-pass filter 110 are depicted as blocks with arrows. The arrows denote that parameters of the gain stage 108 and the high-pass filter 110 are tunable to achieve different operating points of the circuit 100. In an example, a gain of the gain stage 108 is tuned by changing a transistor width of one or more transistors included in the gain stage 108. Similarly, a cutoff frequency of the high-pass filter 110 is tuned by changing a capacitance value of one or more capacitors included in the high-pass filter 110. Additionally, adjusting these parameters of the gain stage 108 and/or the high-pass filter 110 allows a power consumption and a phase noise of the crystal oscillator circuit 100 to be tuned. The tuning of the power consumption and the phase noise are described in further detail below with reference to FIGS. 6 and 7.

Figure 2:
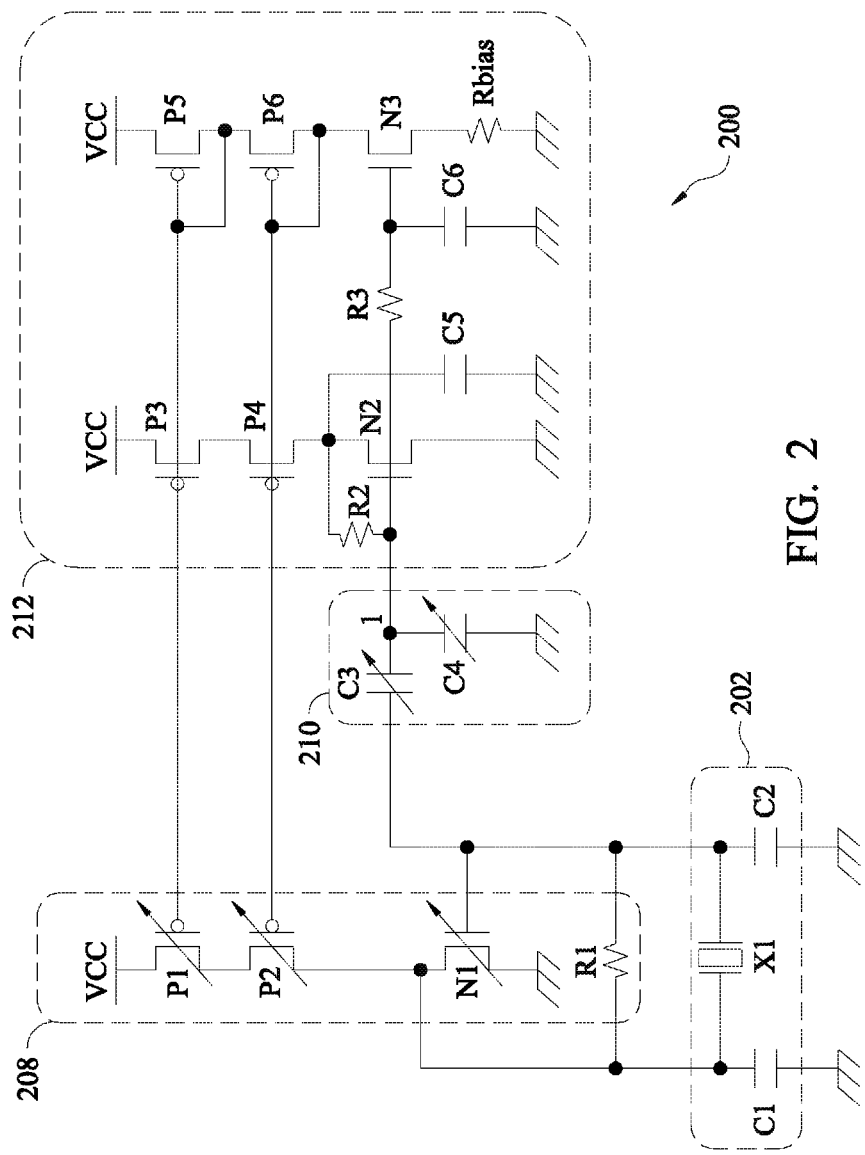
FIG. 2 depicts a schematic diagram of a crystal oscillator circuit, in accordance with some embodiments.

FIG. 2 depicts a schematic diagram of a crystal oscillator circuit 200, in accordance with some embodiments. As in FIG. 1, the crystal oscillator circuit 200 of FIG. 2 includes an oscillator module 202, a gain stage 208, a high-pass filter 210, and an AGC module 212. The gain stage 208 includes first and second PMOS transistors P1, P2 connected in series, where a source terminal of the first PMOS transistor P1 is connected to a power supply voltage (VCC), and a drain terminal of the first PMOS transistor P1 is connected to a source terminal of the second PMOS transistor P2. The gain stage 208 also includes a first NMOS transistor N1, where a drain terminal of the first NMOS transistor N1 is connected to a drain terminal of the second PMOS transistor P2, and a source terminal of the first NMOS transistor N1 is connected to a ground reference voltage. The gain stage 208 further includes a resistor R1 having a first terminal connected to the drain terminal of the first NMOS transistor N1, and a second terminal connected to a gate terminal of the first NMOS transistor N1. The gain stage 208 is configured to provide an amount of gain to the oscillator module 202, and the amount of gain is based on a width of at least one of the first PMOS transistor P1, the second PMOS transistor P2, and the first NMOS transistor N1. The gain stage 208 is configured to provide the amount of gain to the oscillator module 202 based on a gain control signal received from the AGC module 212.

The oscillator module 202 is coupled to the gain stage 208 and includes a piezoelectric crystal resonator X1 having a first terminal connected to the first terminal of the resistor R1, and a second terminal connected to the second terminal of the resistor R1. The oscillator module 202 also includes a first capacitor C1 including a first terminal connected to the first terminal of the piezoelectric crystal resonator X1, and a second terminal connected to the ground reference voltage. A second capacitor C2 of the oscillator module 202 includes a first terminal connected to the second terminal of the piezoelectric crystal resonator X1, and a second terminal connected to the ground reference voltage. The oscillator module 202 is configured to generate an output signal having an oscillation amplitude.

The high-pass filter 210 is coupled to the oscillator module 202 and is configured to filter the output signal to generate a filtered output signal. The high-pass filter 210 includes a third capacitor C3 having a first terminal connected to the gate of the first NMOS transistor N1, and a second terminal connected to a node (i.e., the node labeled "1" in FIG. 2). A fourth capacitor C4 included in the high-pass filter 210 has a first terminal connected to the node labeled "1" and a second terminal connected to the ground reference voltage. The third and fourth capacitors C3, C4 implement the high-pass filter 210, which is configured to receive the output signal from the oscillator module 202 and remove noise in the output signal that has a frequency less than a cutoff frequency. The cutoff frequency is based on a capacitance value of at least one of the third and fourth capacitors C3, C4. The high-pass filter 210 is also configured to reject DC offset in the output signal.

As shown in FIG. 2, the first terminal of the third capacitor C3 of the high-pass filter 210 is connected to the oscillator module 202, and this connection enables the high-pass filter 210 to receive the output signal from the oscillator module 202. As explained above, the high-pass filter 210 filters the output signal to generate the filtered output signal. The second terminal of the third capacitor C3 is connected to the AGC module 212 at the node labeled "1," and this connection allows the AGC module 212 to receive the filtered output signal. As described in further detail below with reference to FIG. 3, the third capacitor C3 is configured to operate as an open circuit when the oscillation amplitude of the output signal is substantially equal to zero, and the open circuit prevents the filtered output signal from being received by the AGC module 212.

The AGC module 212 is coupled to the high-pass filter 210 and includes a first branch and a second branch. The first branch includes third and fourth PMOS transistors P3, P4 connected in series, where a source terminal of the third PMOS transistor P3 is connected to the power supply voltage (VCC), and a drain terminal of the third PMOS transistor P3 is connected to a source terminal of the fourth PMOS transistor P4. The first branch also includes a second NMOS transistor N2, where a drain terminal of the second NMOS transistor N2 is connected to a drain terminal of the fourth PMOS transistor P4, a source terminal of the second NMOS transistor N2 is connected to the ground reference voltage, and a gate terminal of the second NMOS transistor N2 is connected to the node labeled "1." A second resistor R2 couples the drain terminal of the second NMOS transistor N2 to the node labeled "1." A fifth capacitor C5 includes a first terminal connected to the drain terminal of the second NMOS transistor N2, and a second terminal connected to the ground reference voltage.

The second branch of the AGC module 212 includes fifth and sixth PMOS transistors P5, P6 connected in series, where a source terminal of the fifth PMOS transistor P5 is connected to the power supply voltage (VCC), and a drain terminal of the fifth PMOS transistor P5 is connected to a source terminal of the sixth PMOS transistor P6. The drain terminal of the fifth PMOS transistor P5 is connected to a gate terminal of the fifth PMOS transistor P5. The gate terminal of the fifth PMOS transistor P5 is also connected to (i) a gate terminal of the third PMOS transistor P3 and (ii) a gate terminal of the first PMOS transistor P1. A drain terminal of the sixth PMOS transistor P6 is connected to a gate terminal of the sixth PMOS transistor P6. The gate terminal of the sixth PMOS transistor P6 is also connected to (i) a gate terminal of the fourth PMOS transistor P4 and (ii) a gate terminal of the second PMOS transistor P2.

The second branch of the AGC module 212 also includes a third NMOS transistor N3, where a drain terminal of the third NMOS transistor N3 is connected to the drain terminal of the sixth PMOS transistor P6, and a source terminal of the third NMOS transistor N3 is connected to a first terminal of a bias resistor Rbias. A second terminal of the bias resistor Rbias is connected to the ground reference voltage. A third resistor R3 includes a first terminal connected to the node labeled "1," and a second terminal connected to a gate terminal of the third NMOS transistor N3. A sixth capacitor C6 includes a first terminal connected to the gate terminal of the third NMOS transistor N3, and a second terminal connected to the ground reference voltage. The third resistor R3 and the sixth capacitor C6 implement a low-pass filter. The use of the low-pass filter to couple a voltage on the gate terminal of the second NMOS transistor N2 to the gate terminal of the third NMOS transistor N3 is described below with reference to FIG. 4.

The AGC module 212 is configured to generate a gain control signal that is provided to the gain stage 208. To provide the gain control signal to the gain stage 208, the crystal oscillator circuit 200 of FIG. 2 utilizes a current mirror. The current mirror couples the AGC module 212 to the gain stage 208 and causes a current flow in the AGC module 212 to be copied to the gain stage 208, such that the gain control signal is provided from the AGC module 212 to the gain stage 208 via the copying of the current flow.

In FIG. 2, the current mirror includes the first and second PMOS transistors P1, P2 of the gain stage 208 and the fifth and sixth PMOS transistors P5, P6 of the AGC module 212. As shown in the schematic, the gate terminal of the fifth PMOS transistor P5 is connected to the gate terminal of the first PMOS transistor P1, and the gate terminal of the sixth PMOS transistor P6 is connected to the gate terminal of the second PMOS transistor P2. Further, as noted above, the drain terminal of the fifth PMOS transistor P5 is connected to the gate terminal of the fifth PMOS transistor P5, and the drain terminal of the sixth PMOS transistor P6 is connected to the gate terminal of the sixth PMOS transistor P6. Based on such connections, the aforementioned current mirror is formed, with the current mirror causing a current flow in the second branch of the AGC module 212 to be copied to the gain stage 208. Gain control signals are provided from the AGC module 212 to the gain stage 208 via the copying of the current flow of the second branch.

The crystal oscillator circuit 200 of FIG. 2 includes a second current mirror for copying currents between the branches of the AGC module 212. The second current mirror couples the first branch to the second branch and causes a current flow in the second branch to be copied to the first branch. The second current mirror includes the third and fourth PMOS transistors P3, P4 of the first branch of the AGC module 212 and the fifth and sixth PMOS transistors P5, P6 of the second branch. As shown in the schematic, the gate terminal of the fifth PMOS transistor P5 is connected to the gate terminal of the third PMOS transistor P3, and the gate terminal of the sixth PMOS transistor P6 is connected to the gate terminal of the fourth PMOS transistor P4. In each of the fifth and sixth PMOS transistors P5, P6, the drain terminals are connected to the gate terminals, as noted above. Based on these connections, the second current mirror is formed, thus allowing the copying of currents between the branches as described above.

Based on the schematic of FIG. 2 and the corresponding discussion above, it should be appreciated that neither the AGC module 212 nor any other portion of the circuit 200 includes an operational amplifier (op-amp). Conventional crystal oscillator circuits often use one or more op-amps in implementing a gain control module. The use of the one or more op-amps causes the conventional crystal oscillator circuits to have a higher power consumption and a higher phase noise than the crystal oscillator circuit 200. For example, for a given phase noise, a conventional crystal oscillator circuit including an op-amp will generally have a higher power consumption than the crystal oscillator circuit 200 that does not include the op-amp. Further, for a given power consumption, the conventional crystal oscillator circuit including the op-amp will generally have a higher phase noise than the crystal oscillator circuit 200 that does not include the op-amp.

In general, the use of the op-amp in the conventional crystal oscillator circuits results in a large number of transistors. The large number of transistors yields a complicated circuit that has a higher power consumption and a higher phase noise than the crystal oscillator circuit described herein. Thus, by not including the op-amp, the crystal oscillator circuit of the present disclosure has a reduced number of transistors, and this allows the circuit to have a lower power consumption and a lower phase noise than the conventional crystal oscillator circuits.

Figure 3:
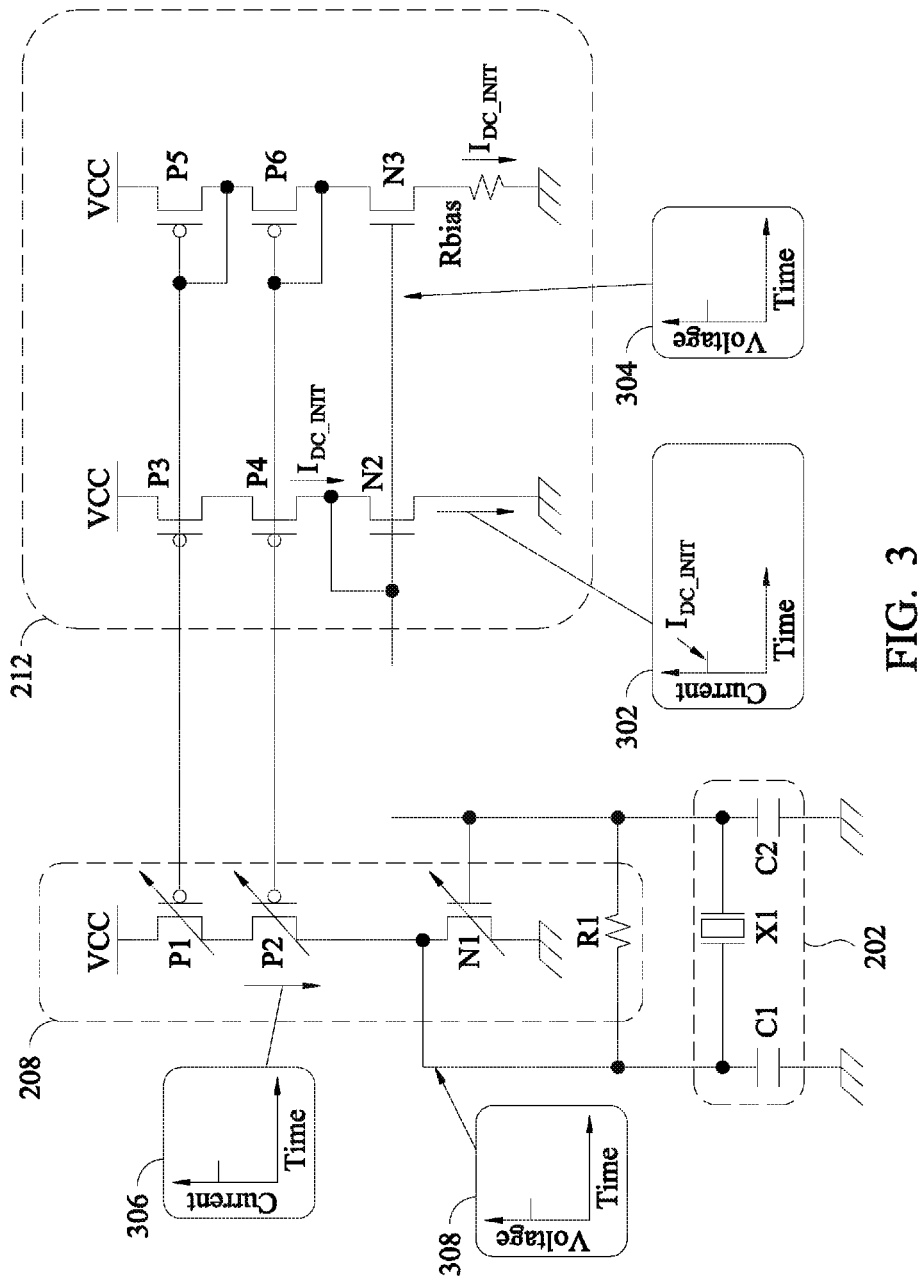
FIG. 3 depicts aspects of an operation of a crystal oscillator circuit during an initial mode of operation, in accordance with some embodiments.
Figure 4:
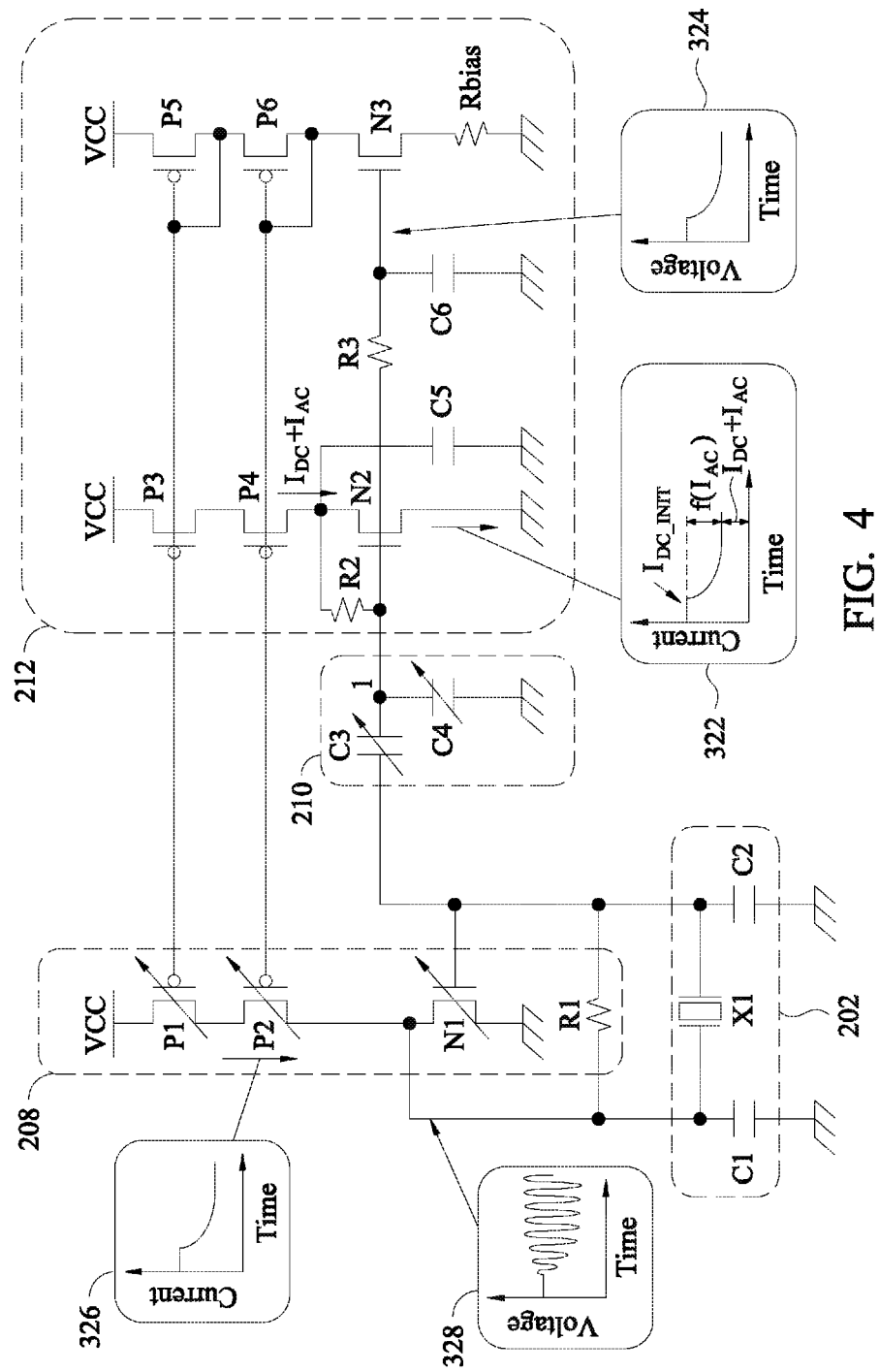
FIG. 4 depicts aspects of an operation of a crystal oscillator circuit during a steady-state mode of operation, in accordance with some embodiments.

As explained above with reference to FIG. 1, the crystal oscillator circuit disclosed herein is operated in at least an initial mode of operation and a steady-state mode of operation. FIGS. 3 and 4 illustrate aspects of the initial and steady-state modes of operation, respectively, in accordance with some embodiments. In the initial mode of operation depicted in FIG. 3, when the oscillator module 202 initiates oscillation (i.e., at t=0), the amplitude of the oscillator output signal is substantially zero, such that the oscillator output signal is a 0 Hz, low-frequency (DC) signal. With the oscillator output signal being in the low-frequency state, capacitors receiving the low-frequency oscillator output signal operate as open circuits. Thus, in the initial mode of operation depicted in FIG. 3, capacitors C3, C4, C5, and C6 are not depicted to illustrate the operation of these capacitors as open circuits. Additionally, in the initial mode of operation, there is no current flow into the resistors R2 and R3 due to the open circuits, and thus, the resistors R2 and R3 operate as short circuits. In FIG. 3, these resistors are replaced with wires to reflect their operation as short circuits.

Because the capacitors C3, C4 of the high-pass filter 210 operate as open circuits in the initial mode of operation, the high-pass filter 210 prevents a filtered output signal generated by the high-pass filter 210 from being received at the AGC module 212. With the filtered output signal not being received at the AGC module 212, the AGC module 212 generates an initial gain control signal that is (i) not based on a configuration of the high-pass filter 210, and (ii) not based on a configuration of the gain stage 208. Further, with the filtered output signal not being received at the AGC module 212, an amplitude detector functionality of the AGC module 212 is effectively disabled, such that the initial gain control signal is not based on the oscillation amplitude of the output signal.

With the amplitude detector functionality of the AGC module 212 disabled in the initial mode of operation, the AGC module 212 operates primarily as a bias generator to generate the initial gain control signal and provide this signal to the gain stage 208. The initial gain control signal controls the gain stage 208 to provide a maximum amount of gain to the oscillation module 202, as described above. In providing the initial gain control signal to the gain stage 208 in the initial mode of operation, an initial DC current flow $I_{DC\_INIT}$ is caused to flow in the first and second branches of the AGC module 212. The initial DC current flow $I_{DC\_INIT}$ is a function of the DC voltage source (VCC) applied at the first and second branches, parameters of the PMOS transistors P3, P4, P5, P6, parameters of the NMOS transistors N2, N3, and the resistor Rbias. In an example, the DC voltage source is a DC voltage of 1.8 V or 3.3 V, and connecting the DC voltage source to the sources of the PMOS transistors P3, P5 causes the $I_{DC\_INIT}$ current flow in the first and second branches.

As described above with reference to FIG. 2, a current mirror couples together the first and second branches of the AGC module 212, causing current flows in the branches to be substantially equal. Thus, FIG. 3 depicts the initial DC current flow $I_{DC\_INIT}$ flowing through both the first and second branches. The initial DC current flow $I_{DC\_INIT}$ depicted at 302 is constant over a period of time corresponding to the initial mode of operation. Because the initial DC current flow $I_{DC\_INIT}$ is constant over this period of time, a voltage on the gate terminals of the NMOS transistors N2, N3 depicted at 304 is also constant over this period of time.

A second current mirror couples the AGC module 212 to the gain stage 208, causing a current flow in the second branch of the AGC module 212 to be copied to the gain stage 208. At 306, FIG. 3 includes a graph showing current in the gain stage 208 as a function of time. The current shown at 306 is a result of the current mirror copying the initial DC current flow $I_{DC\_INIT}$ from the AGC module 212 to the gain stage 208. Consistent with the initial DC current flow $I_{DC\_INIT}$ in the AGC module 212, the current in the gain stage 208 is constant over the period of time corresponding to the initial mode of operation, and likewise, a voltage on the drain of the NMOS transistor N1 depicted at 308 is also constant during this period of time. The initial gain control signal received at the gain stage 208 is the current in the gain stage 208 that is depicted at 306. Thus, it should be appreciated that the initial gain control signal is provided from the AGC module 212 to the gain stage 208 via the copying of the initial DC current flow $I_{DC\_INIT}$ described above. The initial gain control signal (i.e., the current in the gain stage 208 during the initial mode of operation, as shown at 306) provides the maximum amount of gain to the oscillator module 202.

In the steady-state mode of operation depicted in FIG. 4, as the oscillation amplitude of the oscillator output signal increases, the oscillator output signal is no longer a 0 Hz, low-frequency signal. With the oscillator output signal having the amplitude that is not substantially equal to zero, the capacitors C3, C4, C5, and C6 no longer operate as open circuits. In particular, the capacitors C3, C4 of the high-pass filter 210 do not operate as open circuits in the steady-state mode of operation, and the high-pass filter 210 passes the filtered output signal to the AGC module 212. With the filtered output signal being received at the AGC module 212, there is a current flow into the resistors R2 and R2, and thus, these resistors no longer operate as short circuits.

With the filtered output signal being received at the AGC module 212, the AGC module 212 detects the increase in the oscillation amplitude and adjusts the gain control signal to reduce the gain provided by the gain stage 208 to the oscillation module 202. Specifically, in the steady-state mode of operation, the AGC module 212 receives the filtered output signal and utilizes its amplitude detector functionality to detect the oscillation amplitude of the filtered output signal. A steady-state gain control signal is generated by the AGC module 212 based on the detected oscillation amplitude.

In generating the steady-state gain control signal and providing this signal to the gain stage 208 in the steady-state mode of operation, an alternating current (AC) $I_{AC}$ is injected into the first branch of the AGC module 212. The AC current is a result of the filtered output signal that is received at the AGC module 212 from the high-pass filter 210. As explained above, an output signal generated by the oscillation module 202 may be a sine wave or a square wave having an oscillation amplitude, with the signal oscillating around a DC voltage level. The high-pass filter 210 is configured to filter this output signal to generate the filtered output signal. The high-pass filter 210 rejects low-frequency noise in the output signal and rejects DC offset in the output signal, but the filtered output signal is otherwise similar to the output signal generated by the oscillation module 202. The filtered output signal is an oscillating signal that is similar to the output signal, such that the filtered output signal causes the AC current $I_{AC}$ to flow into the AGC module 212.

As shown in FIG. 4, the high-pass filter 210 is connected to the AGC module 212 at the node labeled "1," and the AC current $I_{AC}$ is injected into the first branch of the AGC module 212 via this node. A current through the left branch is equal to a summation of $I_{DC}$ and $I_{AC}$, where $I_{DC}$ is the DC current flowing through the first branch as a result of the DC voltage source (VCC) connected to the PMOS transistor P3. A voltage at the gate of the second NMOS transistor N2 is reduced as a result of the AC current $I_{AC}$ injected into the first branch. This voltage is reduced in order to reduce the summation of $I_{DC}$ and $I_{AC}$, because the summation cannot be larger than the initial DC current flow $I_{DC\_INIT}$, and reducing the voltage at the gate of the second NMOS transistor N2 reduces the DC current $I_{DC}$. With the reduced DC current $I_{DC}$, the summation of $I_{DC}$ and $I_{AC}$ becomes less than $I_{DC\_INIT}$.

The reduced current flow in the first branch is illustrated at 322, which depicts a graph showing the reduction of the current flow from the initial DC current flow $I_{DC\_INIT}$ (which occurred in the initial mode of operation, as described above with reference to FIG. 3) to the steady-state current flow that is the summation of $I_{DC}$ and $I_{AC}$. The graph at 322 further illustrates via the notation $f(I_{AC})$ that the reduction of the current flow from the initial DC current flow $I_{DC\_INIT}$ to the steady state current flow $I_{DC}+I_{AC}$ is a result of the AC current $I_{AC}$ being injected into the first branch, as described above.

The reduced voltage on the gate terminal of the second NMOS transistor N2 is copied to the gate terminal of the third NMOS transistor N3 via the low-pass filter implemented via the resistor R3 and the capacitor C6. The reduced voltage on the gate terminal of the third NMOS transistor N3 is depicted in a graph at 324, which shows the voltage at the gate terminal being reduced from its initial value (which occurred in the initial mode of operation, as described above with reference to FIG. 3) to a steady-state value as a result of the copying of the voltage from the gate terminal of the second NMOS transistor N2. The reduced voltage on the gate terminal of the third NMOS transistor N3 reduces a current flow in the second branch.

The second current mirror coupling the AGC module 212 to the gain stage 208 causes the reduced current flow in the second branch of the AGC module 212 to be copied to the gain stage 208. At 326, FIG. 4 depicts a graph showing current in the gain stage 208 as a function of time. The current shown at 326 is a result of the current mirror copying the reduced current flow in the second branch of the AGC module 212 to the gain stage 208. Consistent with the reduced current flow in the second branch, the current in the gain stage 208 decreases over time from its initial value (which occurred in the initial mode of operation, as described above with reference to FIG. 3). The current in the gain stage 208 in the steady-state mode of operation is primarily a function of the AC current $I_{AC}$ injected into the AGC module 212, and the AC current $I_{AC}$ corresponds to the oscillation amplitude of the output signal generated by the oscillator module 202.

The steady-state current in the gain stage 208 is the steady-state control signal provided by the AGC module 212. Thus, it should be appreciated that the steady-state control signal is provided from the AGC module 212 to the gain state 208 via the copying of the current flow via the current mirror. The steady-state gain control signal (i.e., the current in the gain stage 208 during the steady-state mode of operation, as shown at 326) provides an amount of gain to the oscillation module 202 to sustain the oscillation amplitude of the oscillator output signal in the steady-state. A voltage on the drain of the NMOS transistor N1 depicted at 328 shows the amplification of the oscillation signal provided by the gain stage 208 and the sustaining of the oscillation in the steady-state mode of operation.

Figure 5:
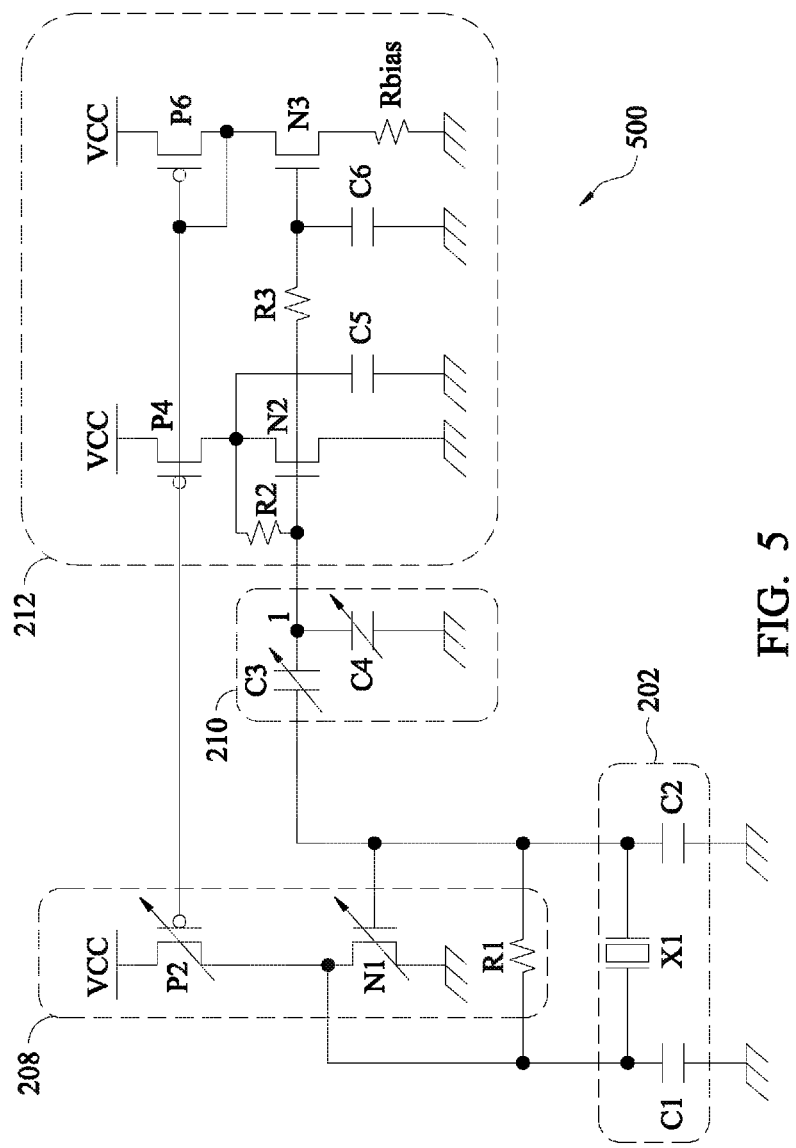
FIG. 5 depicts a schematic diagram of a crystal oscillator circuit, in accordance with some embodiments.

FIG. 5 depicts a schematic diagram of a crystal oscillator circuit 500, in accordance with some embodiments. The schematic diagrams depicted in FIGS. 2-4 are examples only, and it should be understood that the crystal oscillator circuit disclosed herein can be implemented with various modifications. One such modification is illustrated in FIG. 5. The crystal oscillator circuit 500 is similar to the crystal oscillator circuit 200 illustrated in FIG. 2, but in the circuit 500 of FIG. 5, PMOS transistors P1, P3, and P5 have been removed, and the VCC voltage source is connected to the source terminals of the PMOS transistors P2, P4, and P6. The current mirror functionality is still implemented in the circuit 500, despite the removal of the PMOS transistors P1, P3, and P5, and the circuit 500 has a small number of transistors than the circuit 200. The circuit 500 of FIG. 5 operates in a manner similar to that of the circuit 200 of FIG. 2, and for brevity, the description of this operation is not repeated.

Figure 6:
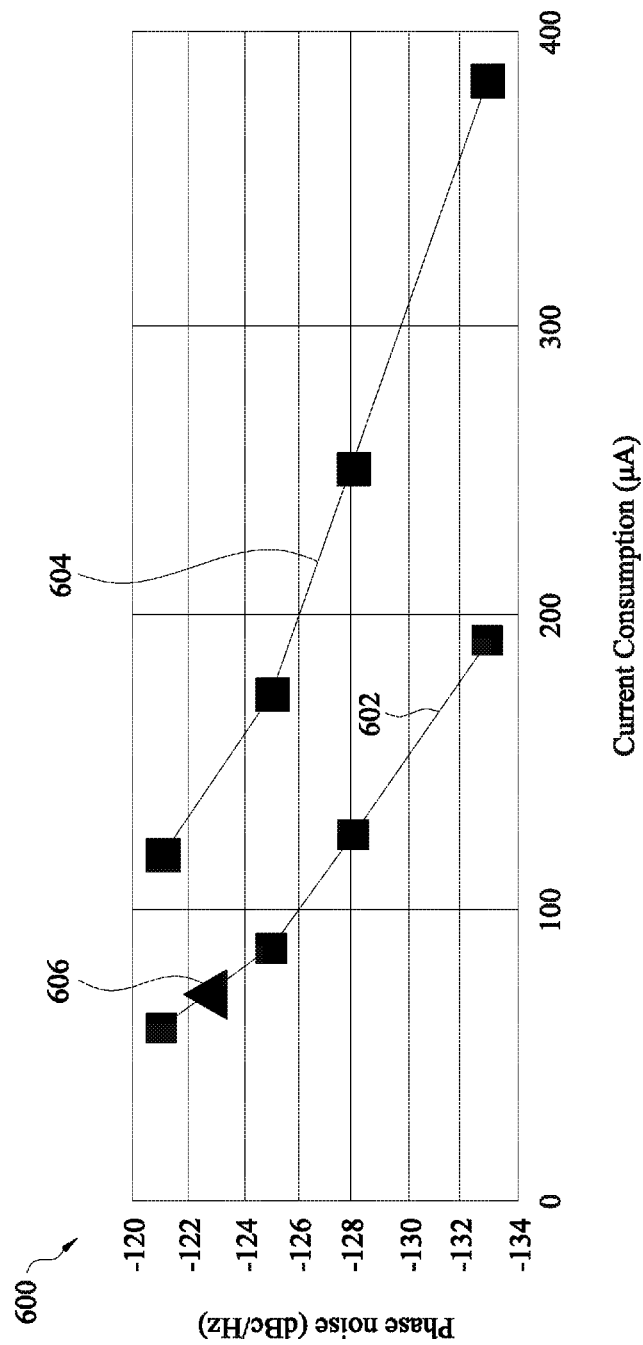
FIG. 6 is a graph illustrating variation in phase noise and current consumption in an exemplary crystal oscillator circuit, in accordance with some embodiments.

FIG. 6 is a graph 600 illustrating variation in phase noise and current consumption in an exemplary crystal oscillator circuit, in accordance with some embodiments. As described above, various parameters of the crystal oscillator circuit described herein are tunable to achieve different operating points. For example, in FIG. 1, arrows depicted in conjunction with the gain stage 108 and the high-pass filter 110 denote that parameters of these components 108, 110 are tunable to achieve different operating points of the crystal oscillator circuit.

Similarly, in FIG. 2, transistors P1, P2, N1 of the gain stage 208 and capacitors C3, C4 of the high-pass filter 210 are depicted with arrows. These arrows denote that parameters of the transistors P1, P2, N1 and capacitors C3, C4 are tunable to achieve different operating points of the crystal oscillator circuit. In an example, a gain of the gain stage 208 is tuned by changing a transistor width of one or more of the transistors P1, P2, N1. Similarly, a cutoff frequency of the high-pass filter 210 is tuned by changing a capacitance value of one or more of the capacitors C3, C4 included in the high-pass filter 210.

Adjusting these parameters of the gain stage and/or the high-pass filter also allows a power consumption and a phase noise of the crystal oscillator circuit to be varied. The graph 600 illustrates aspects of tuning the crystal oscillator circuit described herein. A curve 602 of the graph 600 is associated with the crystal oscillator circuit and illustrates that adjusting parameters of the gain stage (e.g., adjusting transistor widths of transistors of the gain stage) and/or the high-pass filter (e.g., adjusting capacitance values of capacitors of the high-pass filter) enables wide-range control of the current consumption and phase noise of the circuit. The curve 602 shows that for a lower current consumption, the circuit exhibits a higher phase noise, and for a higher current consumption, the circuit exhibits a lower phase noise. As is also shown in the curve 602, for a lower phase noise, the circuit exhibits a higher current consumption, and for a higher phase noise, the circuit exhibits a lower current consumption.

The curve 602 shows that the crystal oscillator circuit described herein permits variation of the phase noise within a wide range of more than 10 dB. Further, to achieve the range of phase noise and current consumption values shown in the curve 602, an overall design of the crystal oscillator circuit does not change, and instead, only select parameters (e.g., a transistor width of one or more of the transistors P1, P2, N1 and/or a capacitance value of one or more of the capacitors C3, C4) are tuned. This is in contrast to conventional crystal oscillator circuits that do not cover a wide range of operating points for phase noise and power consumption. Such conventional crystal oscillator circuits require extensive redesigning of the circuit to achieve different operating points. A point 606 on the graph 600 corresponds to one such conventional circuit. The conventional circuit is designed to operate at the phase noise and current consumption associated with the point 606, but the conventional circuit is not tunable to achieve other operating points. To achieve other such operating points, an entire redesign of the conventional circuit is required, and this is undesirable.

The curve 604 of the graph 600 corresponds to a conventional crystal oscillator circuit that utilizes one or more op-amps in a gain control circuit. As explained above, the use of the one or more op-amps causes conventional crystal oscillator circuits to have a higher power consumption and a higher phase noise than the crystal oscillator circuit described herein. As shown in the graph 600, for a given phase noise, the conventional crystal oscillator circuit including the one or more op-amps has a higher current consumption than the crystal oscillator circuit described herein. This is seen by comparing the curves 602 and 604. Further, for a given current consumption, the conventional crystal oscillator including the op-amp has a higher phase noise than the crystal oscillator circuit described herein. The lower current consumption and lower phase noise over the range of values shown in the curve 602 allow the crystal oscillator circuit described herein to be used, for example, in Internet of Things ("IoT") applications.

Figure 7:
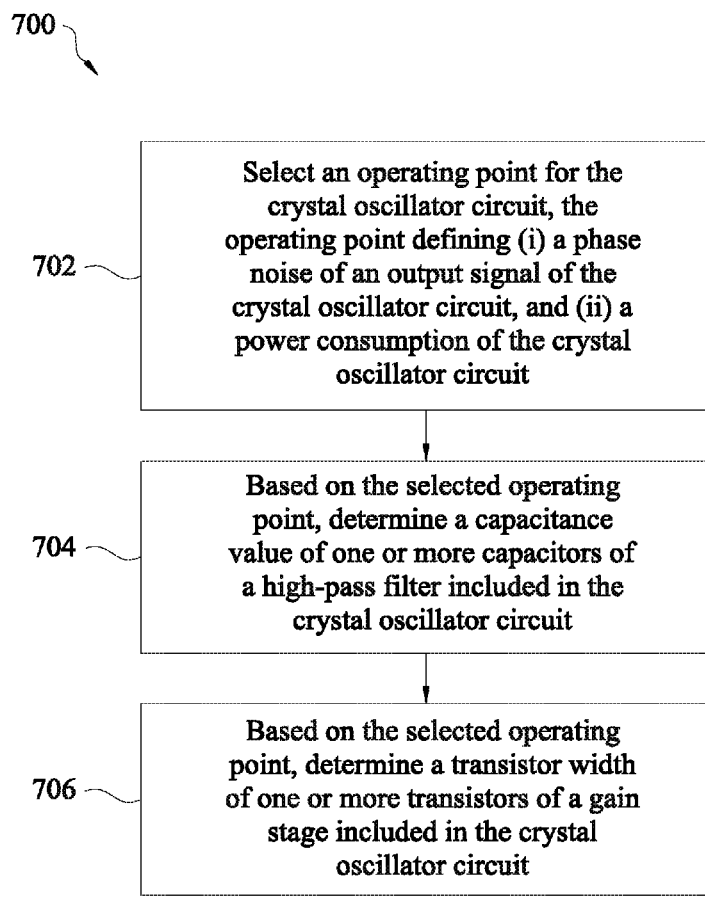
FIG. 7 is a flow diagram depicting steps of a method for designing a crystal oscillator circuit, in accordance with some embodiments.

FIG. 7 is a flow diagram 700 depicting steps of a method for designing a crystal oscillator circuit, in accordance with some embodiments. At 702, an operating point is selected for the crystal oscillator circuit, where the operating point defines (i) a phase noise of an output signal of the crystal oscillator circuit, and (ii) a power consumption of the crystal oscillator circuit. At 704, based on the selected operating point, a capacitance value of one or more capacitors of a high-pass filter included in the crystal oscillator circuit is determined. At 706, based on the selected operating point, a transistor width of one or more transistors of a gain stage included in the crystal oscillator circuit is determined. The crystal oscillator circuit includes an oscillator module configured to generate an output signal having an oscillation amplitude. The crystal oscillator circuit also includes the high-pass filter configured to filter the output signal to generate a filtered output signal. The high-pass filter prevents the filtered output signal from being received by an automatic gain control (AGC) module when the oscillation amplitude is substantially equal to zero, and the high-pass filter passes the filtered output signal to the AGC module when the oscillation amplitude is not substantially equal to zero. The AGC module is configured to generate an initial gain control signal when the filtered output signal is not received by the AGC module, where the initial gain control signal is (i) not based on a configuration of the high-pass filter, and (ii) not based on a configuration of a gain stage. The AGC module is also configured to generate a steady-state gain control signal when the filtered output signal is received by the AGC module, where the steady-state gain control signal is based on the oscillation amplitude. The crystal oscillator circuit also includes the gain stage configured to provide a first amount of gain to the oscillator module based on the initial gain control signal and a second amount of gain to the oscillator module based on the steady-state gain control signal.

The present disclosure is directed to a crystal oscillator circuit. As described above, the crystal oscillator circuit includes an AGC module that does utilize an op-amp, thus allowing the crystal oscillator circuit to exhibit lower phase noise and lower power consumption as compared to conventional crystal oscillator circuits that utilize such op-amps. Further, parameters of the crystal oscillator circuit described herein can be tuned to achieve operation over a wide range of phase noise and power consumption operating points. Conventional crystal oscillator circuits generally do not allow for such tuning and instead require redesign of the entire circuit to vary the operating point. The crystal oscillator circuit described herein can be implemented via many different types of processes (e.g., 28 nm planar processing, 16 nm FinFET processing, etc.).

The present disclosure is directed to a crystal oscillator circuit and a method for designing a crystal oscillator circuit. In an embodiment of a crystal oscillator circuit, the crystal oscillator circuit includes an oscillator module configured to generate an output signal having an oscillation amplitude. The crystal oscillator circuit also includes a high-pass filter configured to filter the output signal to generate a filtered output signal. The crystal oscillator circuit also includes an automatic gain control (AGC) module configured to generate an initial gain control signal when the filtered output signal is not received by the AGC module. The high-pass filter is configured to prevent the filtered output signal from being received by the AGC module when the oscillation amplitude is substantially equal to zero. The AGC module is configured to generate a steady-state gain control signal when the filtered output signal is received by the AGC module. The high-pass filter is configured to pass the filtered output signal to the AGC module when the oscillation amplitude is not substantially equal to zero. The steady-state gain control signal is based on the oscillation amplitude. The crystal oscillator circuit also includes a gain stage configured to provide a first amount of gain to the oscillator module based on the initial gain control signal and a second amount of gain to the oscillator module based on the steady-state gain control signal.

Another embodiment of a crystal oscillator circuit includes an oscillator module configured to generate an output signal having an oscillation amplitude. The crystal oscillator circuit also includes a high-pass filter configured to filter the output signal to generate a filtered output signal. The crystal oscillator circuit also includes an automatic gain control (AGC) module including an amplitude detector. The amplitude detector is configured to detect the oscillation amplitude, and the amplitude detector is disabled when the filtered output signal is not received by the AGC module. The high-pass filter is configured to prevent the filtered output signal from being received by the AGC module when the oscillation amplitude is substantially equal to zero. The AGC module also includes a bias generator coupled to the amplitude detector and configured to generate an initial gain control signal and a steady-state gain control signal. The steady-state gain control signal is based on the oscillation amplitude detected by the amplitude detector and is generated when the filtered output signal is received by the AGC module. The high-pass filter is configured to pass the filtered output signal to the AGC module when the oscillation amplitude is not substantially equal to zero. The initial gain control signal is generated when the filtered output signal is not received by the AGC module. The crystal oscillator circuit also includes a gain stage configured to provide a first amount of gain to the oscillator module based on the initial gain control signal and a second amount of gain to the oscillator module based on the steady-state gain control signal.

In an embodiment of a method for designing a crystal oscillator circuit, an operating point is selected for the crystal oscillator circuit, where the operating point defines (i) a phase noise of an output signal of the crystal oscillator circuit, and (ii) a power consumption of the crystal oscillator circuit. Based on the selected operating point, a capacitance value of one or more capacitors of a high-pass filter included in the crystal oscillator circuit is determined. Based on the selected operating point, a transistor width of one or more transistors of a gain stage included in the crystal oscillator circuit is determined.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A crystal oscillator circuit comprising:
   an oscillator module configured to generate an output signal having an oscillation amplitude;
   a high-pass filter configured to receive the output signal from the oscillator module and filter the output signal to generate a filtered output signal;
   an automatic gain control (AGC) module configured to:
      generate an initial gain control signal when the filtered output signal is not received by the AGC module, the high-pass filter being configured to prevent the filtered output signal from being received by the AGC module when the oscillation amplitude is substantially equal to zero, and
      generate a steady-state gain control signal when the filtered output signal is received by the AGC module, the high-pass filter being configured to pass the filtered output signal to the AGC module when the oscillation amplitude is not substantially equal to zero, wherein the steady-state gain control signal is based on the oscillation amplitude; and
   a gain stage configured to (i) receive the initial gain control signal and the steady-state gain control signal from the AGC module, and (ii) provide a first amount of gain to the oscillator module based on the initial gain control signal and a second amount of gain to the oscillator module based on the steady-state gain control signal.

2. The crystal oscillator circuit of claim 1, wherein the gain stage (i) receives the initial gain control signal, and (ii) based on the receipt of the initial gain control signal, provides a maximum amount of gain to the oscillator module.

3. The crystal oscillator circuit of claim 1, wherein a phase noise of the output signal and a power consumption of the crystal oscillator circuit are based on:
   a transistor width of one or more transistors included in the gain stage, and
   a capacitance value of one or more capacitors included in the high-pass filter.

4. The crystal oscillator circuit of claim 1, wherein the AGC module includes a first branch coupled to a second branch, a first terminal of the high-pass filter is connected to the oscillator module, a second terminal of the high-pass filter is connected to the AGC module, an alternating current (AC) current flow is injected into the first branch via the second terminal of the high-pass filter, a voltage on a gate terminal of a first transistor included in the first branch is reduced by the AC current flow, the reduced voltage on the gate terminal of the first transistor is copied to a gate terminal of a second transistor included in the second branch via a low-pass filter, and the reduced voltage on the gate terminal of the second transistor is arranged to reduce a current flow in the second branch.

5. The crystal oscillator circuit of claim 1, wherein the AGC module does not include an operational amplifier.

6. The crystal oscillator circuit of claim 1, wherein the high-pass filter is coupled to the oscillator module and configured to (i) remove low-frequency noise in the output signal, and (ii) reject DC offset in the output signal, the DC offset causing a DC bias level of the output signal to vary from a nominal value.

7. The crystal oscillator circuit of claim 1, wherein the gain stage (i) receives the initial gain control signal, and (ii) based on the receipt of the initial gain control signal, provides a maximum amount of gain to the oscillator module, the initial gain control signal being predetermined to cause the gain stage to provide the maximum amount of gain, and the maximum amount of gain causing the output signal to be amplified and causing the oscillation amplitude to be greater than zero.

8. The crystal oscillator circuit of claim 1 comprising:
   a current mirror that couples the AGC module to the gain stage, the current mirror being configured to cause a current flow in the AGC module to be copied to the gain stage, wherein the initial gain control signal and the steady-state gain control signal are provided to the gain stage from the AGC module via the copying of the current flow.

9. The crystal oscillator circuit of claim 8, wherein the current mirror includes:
   first and second PMOS transistors of the AGC module that are connected in series, a source terminal of the first PMOS transistor being connected to a power supply voltage, and a drain terminal of the first PMOS transistor being connected to a source terminal of the second PMOS transistor; and
   third and fourth PMOS transistors of the gain stage that are connected in series, a source terminal of the third PMOS transistor being connected to the power supply voltage, a drain terminal of the third PMOS transistor being connected to a source terminal of the fourth PMOS transistor, a gate terminal of the first PMOS transistor being connected to a gate terminal of the third PMOS transistor, a gate terminal of the second PMOS transistor being connected to a gate terminal of the fourth PMOS transistor, the drain terminal of the first PMOS transistor being connected to the gate terminal of the first PMOS transistor, and the drain terminal of the second PMOS transistor being connected to the gate terminal of the second PMOS transistor.

10. The crystal oscillator circuit of claim 8, wherein the AGC module includes a first branch and a second branch, the crystal oscillator circuit further comprising:
   a second current mirror that couples the first branch to the second branch, the second current mirror being configured to cause a current flow in the second branch to be copied to the first branch.

11. The crystal oscillator circuit of claim 10, wherein the second current mirror includes:
   first and second PMOS transistors of the first branch that are connected in series, a source terminal of the first PMOS transistor being connected to a power supply voltage, and a drain terminal of the first PMOS transistor being connected to a source terminal of the second PMOS transistor; and
   third and fourth PMOS transistors of the second branch that are connected in series, a source terminal of the third PMOS transistor being connected to the power supply voltage, a drain terminal of the third PMOS transistor being connected to a source terminal of the fourth PMOS transistor, a gate terminal of the first PMOS transistor being connected to a gate terminal of the third PMOS transistor, a gate terminal of the second PMOS transistor being connected to a gate terminal of the fourth PMOS transistor, the drain terminal of the first PMOS transistor being connected to the gate terminal of the first PMOS transistor, and the drain terminal of the second PMOS transistor being connected to the gate terminal of the second PMOS transistor.

12. The crystal oscillator circuit of claim 1, wherein the high-pass filter includes:
   a first capacitor having a first terminal connected to the oscillator module, and a second terminal connected to a node that is coupled to the AGC module, the AGC module being configured to receive the filtered output signal from the high-pass filter via the node; and a second capacitor having a first terminal connected to the node, and a second terminal connected to a ground reference voltage.

13. The crystal oscillator circuit of claim 12, wherein the first capacitor operates as an open circuit when the oscillation amplitude of the output signal is substantially equal to zero, the open circuit preventing the filtered output signal from being received by the AGC module.

14. The crystal oscillator circuit of claim 12, wherein the high-pass filter is coupled to the oscillator module and configured to remove noise in the output signal that has a frequency less than a cutoff frequency, the cutoff frequency being based on a capacitance value of at least one of the first capacitor and the second capacitor.

15. The crystal oscillator circuit of claim 1, wherein the gain stage includes:

first and second PMOS transistors connected in series, a source terminal of the first PMOS transistor being connected to a power supply voltage, and a drain terminal of the first PMOS transistor being connected to a source terminal of the second PMOS transistor;

a first NMOS transistor, a drain terminal of the first NMOS transistor being connected to a drain terminal of the second PMOS transistor, and a source terminal of the first NMOS transistor being connected to a ground reference voltage; and a resistor having a first terminal connected to the drain terminal of the first NMOS transistor, and a second terminal connected to a gate terminal of the first NMOS transistor.

16. The crystal oscillator circuit of claim 15, wherein the oscillator module includes:

a piezoelectric crystal resonator having a first terminal connected to the first terminal of the resistor, and a second terminal connected to the second terminal of the resistor;

a first capacitor including a first terminal connected to the first terminal of the piezoelectric crystal resonator, and a second terminal connected to the ground reference voltage; and a second capacitor including a first terminal connected to the second terminal of the piezoelectric crystal resonator, and a second terminal connected to the ground reference voltage, wherein the high-pass filter includes:

a third capacitor having a first terminal connected to the gate of the first NMOS transistor, and a second terminal connected to a node; and a fourth capacitor having a first terminal connected to the node, and a second terminal connected to the ground reference voltage.

17. The crystal oscillator circuit of claim 16, wherein the AGC module includes a first branch, the first branch including:

third and fourth PMOS transistors connected in series, a source terminal of the third PMOS transistor being connected to the power supply voltage, and a drain terminal of the third PMOS transistor being connected to a source terminal of the fourth PMOS transistor; and a second NMOS transistor, a drain terminal of the second NMOS transistor being connected to a drain terminal of the fourth PMOS transistor, a source terminal of the second NMOS transistor being connected to the ground reference voltage, and a gate terminal of the second NMOS transistor being connected to the node, the crystal oscillator circuit further comprising:

a second resistor that couples the drain terminal of the second NMOS transistor to the node; and a fifth capacitor that includes a first terminal connected to the drain terminal of the second NMOS transistor, and a second terminal connected to the ground reference voltage.

18. The crystal oscillator circuit of claim 17, wherein the AGC module includes a second branch, the second branch including:

fifth and sixth PMOS transistors connected in series, a source terminal of the fifth PMOS transistor being connected to the power supply voltage, and a drain terminal of the fifth PMOS transistor being connected to a source terminal of the sixth PMOS transistor, the drain terminal of the fifth PMOS transistor being connected to a gate terminal of the fifth PMOS transistor, the gate terminal of the fifth PMOS transistor being connected to (i) a gate terminal of the third PMOS transistor and (ii) a gate terminal of the first PMOS transistor, a drain terminal of the sixth PMOS transistor being connected to a gate terminal of the sixth PMOS transistor, and the gate terminal of the sixth PMOS transistor being connected to (i) a gate terminal of the fourth PMOS transistor and (ii) a gate terminal of the second PMOS transistor; and a third NMOS transistor, a drain terminal of the third NMOS transistor being connected to the drain terminal of the sixth PMOS transistor, a source terminal of the third NMOS transistor being connected to a first terminal of a bias resistor, a second terminal of the bias resistor being connected to the ground reference voltage, the crystal oscillator circuit further comprising:

a third resistor including a first terminal connected to the node, and a second terminal connected to a gate terminal of the third NMOS transistor; and a sixth capacitor including a first terminal connected to the gate terminal of the third NMOS transistor, and a second terminal connected to the ground reference voltage.

19. A crystal oscillator circuit comprising:

an oscillator module configured to generate an output signal having an oscillation amplitude;

a high-pass filter configured to filter the output signal to generate a filtered output signal;

an automatic gain control (AGC) module including:

an amplitude detector configured to detect the oscillation amplitude, the amplitude detector being disabled when the filtered output signal is not received by the AGC module, the high-pass filter being configured to prevent the filtered output signal from being received by the AGC module when the oscillation amplitude is substantially equal to zero, and a bias generator coupled to the amplitude detector and configured to generate an initial gain control signal and a steady-state gain control signal, the steady-state gain control signal being based on the oscillation amplitude detected by the amplitude detector and being generated by the bias generator when the filtered output signal is received by the AGC module, the high-pass filter being configured to pass the filtered output signal to the AGC module when the oscillation amplitude is not substantially equal to zero, wherein the initial gain control signal is generated by the bias generator when the filtered output signal is not received by the AGC module; and a gain stage configured to provide a first amount of gain to the oscillator module based on the initial gain control signal and a second amount of gain to the oscillator module based on the steady-state gain control signal.

* * * * *